US008969185B2

(12) United States Patent
Peng

(10) Patent No.: US 8,969,185 B2
(45) Date of Patent: Mar. 3, 2015

(54) MANUFACTURING APPARATUS AND MANUFACTURING METHOD FOR QUANTUM DOT MATERIAL

(75) Inventor: Changsi Peng, Jiangsu (CN)

(73) Assignee: Soochow University, Jiangsu (CN)

( * ) Notice: Subject to any disclaimer, the term of this patent is extended or adjusted under 35 U.S.C. 154(b) by 0 days.

(21) Appl. No.: 14/233,679

(22) PCT Filed: Jul. 2, 2012

(86) PCT No.: PCT/CN2012/078013
§ 371 (c)(1),
(2), (4) Date: Jan. 17, 2014

(87) PCT Pub. No.: WO2013/020423
PCT Pub. Date: Feb. 14, 2013

(65) Prior Publication Data
US 2014/0295653 A1 Oct. 2, 2014

(30) Foreign Application Priority Data
Aug. 5, 2011 (CN) .......................... 2011 1 0224270

(51) Int. Cl.
H01L 21/20 (2006.01)
H01L 21/36 (2006.01)
(Continued)

(52) U.S. Cl.
CPC .... *H01L 21/02601* (2013.01); *H01L 21/02546* (2013.01); *H01L 21/0259* (2013.01); *H01L 21/02631* (2013.01); *H01L 21/02395* (2013.01);
(Continued)

(58) Field of Classification Search
USPC ............................ 438/478–509; 977/773, 774
See application file for complete search history.

(56) References Cited

U.S. PATENT DOCUMENTS 4,945,254 A * 7/1990 Robbins .................... 250/559.16
5,186,750 A * 2/1993 Sugiura et al. ............... 118/50.1
(Continued)

FOREIGN PATENT DOCUMENTS

CN 20091141087 7/2003
CN 20061144304 12/2006
(Continued)

OTHER PUBLICATIONS

International Search Report dated Oct. 4, 2012, from PCT/CN2012/078013.
(Continued)

*Primary Examiner* — Karen Kusumakar
(74) *Attorney, Agent, or Firm* — Swanson & Bratschun, L.L.C.

(57) ABSTRACT

A manufacturing apparatus and a manufacturing method for a quantum dot material. The manufacturing apparatus adds an optical device capable of generating an interference pattern in an existing epitaxial apparatus, so that a substrate applies an interference pattern on an epitaxial layer while performing epitaxial growth. By means of the interference pattern, a regularly distributed temperature field is formed on the epitaxial layer, so that on the epitaxial layer, an atom aggregation phenomenon is formed at dot positions with higher temperature, but no atoms are aggregated on areas having relatively lower temperature. Therefore, according to the temperature distribution on the surface of the epitaxial layer, positions where quantum dots generate can be controlled manually without introducing defects, thereby achieving a defect-free and long-range ordered quantum dot manufacturing.

8 Claims, 5 Drawing Sheets

(51) Int. Cl.
*H01L 33/00* (2010.01)
*H01L 21/02* (2006.01)
*B82Y 20/00* (2011.01)
B82Y 40/00 (2011.01)
H01S 5/34 (2006.01)

(52) U.S. Cl.
CPC ........... *H01L 21/02664* (2013.01); *B82Y 20/00* (2013.01); *B82Y 40/00* (2013.01); *H01S 5/3412* (2013.01); *H01S 2304/00* (2013.01); *H01S 2304/02* (2013.01); *H01S 2304/04* (2013.01)
USPC .......................................... 438/509; 438/507

(56) References Cited

U.S. PATENT DOCUMENTS

| | | | |
|---|---|---|---|
| 6,329,668 B1 | 12/2001 | Razeghi | |
| 2005/0219548 A1* | 10/2005 | Muroya | 356/504 |
| 2006/0065902 A1* | 3/2006 | Todori et al. | 257/79 |
| 2007/0082411 A1* | 4/2007 | Muys | 436/524 |
| 2007/0196937 A1* | 8/2007 | Itoh et al. | 438/22 |

FOREIGN PATENT DOCUMENTS

| | | |
|---|---|---|
| CN | 20091112931 | 12/2009 |
| CN | 20101179562 | 5/2010 |
| WO | WO 2009/145370 | 12/2009 |

OTHER PUBLICATIONS

Verevkin, et al. (2010) Quantum Electronics 40(1):73-76, "Sub-20 nm island self-orgnisation stimulated by spatially periodic laser exposure in the GaAs/InGaAs/GaAs epitaxial system".

* cited by examiner

MANUFACTURING APPARATUS AND MANUFACTURING METHOD FOR QUANTUM DOT MATERIAL

RELATED APPLICATIONS

This application is a 35 U.S.C. §371 national phase application of PCT/CN2012/078013 (WO 2013/020423), filed on Jul. 2, 2012, entitled "Manufacturing Apparatus And Manufacturing Method For Quantum Dot Material", which application claims priority to Chinese Application No. 201110224270.7, filed Aug. 5, 2011, each of which is incorporated herein by reference in its entirety.

TECHNICAL FIELD

The present invention relates to the field of the manufacturing low-dimension semiconductor materials, and in particular, to an apparatus and a method for manufacturing a quantum dot semiconductor material.

BACKGROUND

A low-dimension quantum dot semiconductor nanomaterial has excellent photoelectronic properties because of its special electronic structure and density of states, which may widely be applied to various fields such as nanoelectronics, photoelectronics, life sciences and quantum computation. It is indicated with theoretical analysis that a quantum dot laser has better performance than a quantum well laser, for example, higher gain, lower threshold current, higher quantum efficiency, better thermal stability. In addition, the quantity of electrons entering into or leaving away from quantum dots may be precisely controlled in a single electron with an electron tunneling effect of the quantum dots. Therefore, a single-electron transistor may be manufactured. The quantum dots may be probably applied in solid-state quantum computation, a photon detector with vertical incident light, etc.

A Stranski-Krastanow (S-K) self-organized growth is a method for manufacturing a quantum dot material, which is mostly researched by scientists in the world and has an important application value. A basic principle of the S-K self-organized growth is described as follows. In an exptaxial growth process such as Molecular Beam Epitaxy (MBE) of a semiconductor material with a lattice constant different from a substrate, the lattice constant in the direction of the growth is different from that of a substrate, and a lattice stress is accordingly caused. When accumulating to a certain extent, to release the lattice stress, atoms at a surface may be migrated and clustered, and/or a misfit dislocation may be generated. In the case of atoms at a surface migrating and aggregating, atom clusters grow and are buried in an epitaxial material to be grown, so as to form the quantum dots. Initial atom clusters formed for releasing the lattice stress are seeds of the quantum dots and the quantum dots are formed from the seeds. The seeds are formed because of statistical thermodynamics fluctuation, the locations and sizes of the seeds and the speed of forming the seeds are totally random. This is the so called S-K dynamic random growth mechanism of the quantum dots.

As shown in FIG. 1A, the quantum dots currently applied in devices are all disorderly grown with the S-K self-organized epitaxial growth (dynamic random growth). The quantum dots obtained with this approach are defect-free and applicable to the manufacture of devices. It is also proved that the performance of the quantum dot material is obviously better than other materials for similar devices. However, some key parameters such as the sizes and distribution of the quantum dots are random and uncontrollable. Thus, repeatability of production is poor and industrialization is hard to be implemented. The quantum dots grown with this approach cannot be used to manufacture quantum information devices. Even though a few workable devices are found from the devices manufactured in scale, performances of the workable devices may significantly differ from each other. Because the disorderly quantum dots have a wide gain spectrum, it is hard to use the disordered quantum dots to manufacture a high power laser. Short-range ordered quantum dots shown in FIG. 1B are obtained by jetting an etching gas to a substrate to etch some micropores on the substrate and then growing the quantum dots at the micropores. Comparing with disordered self-organized quantum dots, the quantum dots obtained with this approach are ordered in some extent. However, the processing of micropores etching induces large amount of etching defects, which may be maintained and even magnified in the growth of the quantum dots. Long-range ordered quantum dots shown in FIG. 1C are obtained by etching a substrate with common nanomanufacturing technologies to obtain a nano pattern template in advance and then epitaxially growing the quantum dots on the template. Defects introduced by the common nanomanufacturing technologies are worse both in size and scale than the defects caused by the micropores etched by the etching gas. Neither the short-range ordered quantum dots nor the long-range quantum dots may be used to manufacture workable devices because of the defects.

Consequently, how to manufacture long-range ordered quantum dots without a defect or with low defect density in large scale currently becomes a frontier and hot research filed of the low-dimension quantum dot semiconductor nanomaterial.

SUMMARY

Accordingly, a method and an apparatus for manufacturing a quantum dot material are provided in the disclosure. With the method and the apparatus, locations where quantum dots are grown are controlled in-time in the epitaxial growth. A long-range ordered quantum dot material may be manufactured, and defects caused by etching are avoided since the substrate is not required to be etched.

An apparatus for manufacturing a quantum dot material according to the disclosure includes: an epitaxy device, and an optical device for generating an interference pattern. The epitaxy device includes a growth chamber. The growth chamber is a vacuum chamber and is adapted to place a substrate material. A plurality of windows are provided on a wall of the growth chamber to make light incident into the growth chamber. The optical device includes a laser source and a modulating optical path. After emitted from the laser source, a light beam is split into a plurality of beams through the modulating optical path. The plurality of beams respectively pass through the plurality of windows, enter the growth chamber and produce the interference pattern on a surface of the substrate material.

Optionally, the plurality of windows are three windows evenly spaced on the wall of the growth chamber.

Optionally, after emitted from the laser source, the light beam is split into three beams through the modulating optical path, the three beams respectively pass through the three windows, enter the growth chamber and produce a three-beam interference pattern on the surface of the substrate material.

Optionally, the plurality of windows are four windows evenly spaced on the wall of the growth chamber.

Optionally, after emitted from the laser source, the light beam is split into four beams through the modulating optical path, the four beams respectively pass through the four windows, enter the growth chamber and produce a four-beam interference pattern on the surface of the substrate material.

Optionally, the laser source is a pulse laser source.

A method for manufacturing a quantum dot material is provided according to the disclosure. The quantum dot material is manufactured with the foregoing apparatus for manufacturing the quantum dot material. The method includes:
1) loading a substrate material into a growth chamber and vacuating the growth chamber;
2) heating the substrate material to maintain a temperature of the substrate material at a first temperature, and performing a deposition of an epitaxial layer on a surface of the substrate material with an epitaxial approach;
3) controlling a rate of the deposition to deposit the epitaxial layer having a second thickness on the surface of the substrate material, where the second thickness is thinner than a critical thickness under the first temperature;
4) turning on a laser source and generating an interference pattern on a surface of the epitaxial layer, where a temperature of a part of locations on the epitaxial layer is raised to a second temperature based on the interference pattern, a critical thickness under the second temperature is thinner than the second thickness; and
5) after removing the interference pattern, continuing the deposition of the epitaxial layer to finally form quantum dots on a surface of the epitaxial layer.

Optionally, the interference pattern is a periodic dot matrix. The temperature of the epitaxial layer is raised to the second temperature at interference enhancement areas of the periodic dot matrix.

By adding an optical device for producing interference pattern to an existing epitaxy device, the interference pattern is applied on the epitaxial layer when the epitaxial growth is performed on the substrate. A regularly distributed temperature field is formed on the epitaxial layer with the interference pattern. Atoms are clustered at locations of the epitaxial layer with higher temperature, while no atom is clustered at location of the epitaxial layer with lower temperatures. In this way, the locations where the quantum dots are generated may be controlled based on the temperature distribution on the surface of the epitaxial layer, and thus a method for manufacturing long-range order quantum dots is implemented.

BRIEF DESCRIPTION OF DRAWINGS

For explaining a technical solution according to embodiments of the disclosure or the prior art more clearly, drawings to be used in description of the embodiments of the disclosure or the prior art are described briefly. Apparently, the drawings in the following description are merely some of the embodiments of the disclosure, and other drawings may be obtained based on the drawings by those skilled in the art without inventive efforts.

DETAILED DESCRIPTION OF EMBODIMENTS

Figure 1A:
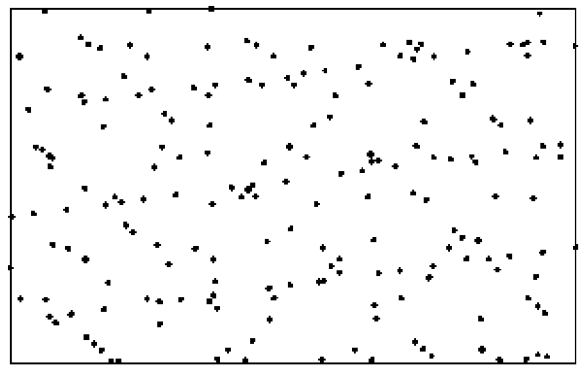
FIG. 1A-1C are diagrams respectively showing distributions of quantum dots on quantum dot materials in prior art.
Figure 1B:
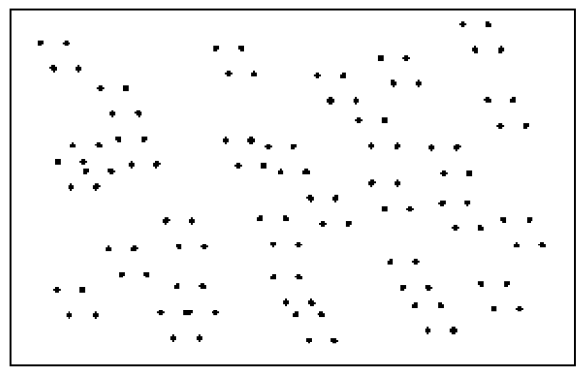
Figure 1C:
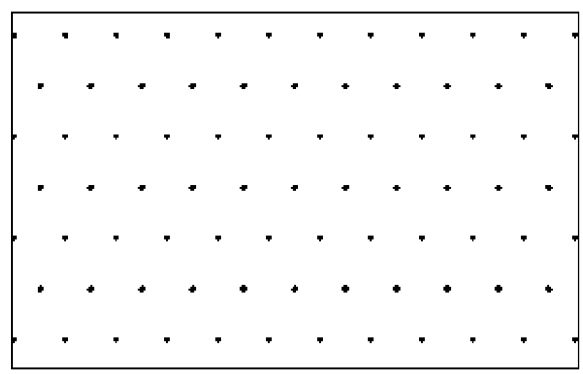

A technical solution according to embodiments of the disclosure is clearly and completely described hereinafter in conjunction with drawings used in the embodiments of the disclosure. Apparently, the described embodiments are merely part of the embodiments of the disclosure rather than all of them. Any other embodiment obtained by those skilled in the art based on the embodiments of the disclosure without inventive efforts should fall in the scope of protection of the disclosure.

As illustrated in the background, most of quantum dot devices require to be made of a quantum dot material without defect (or with low defective density), and the quantum dots in which have uniform size and ordered spatial distribution. However, in existing epitaxial methods for manufacturing quantum dots, the quantum dots generated through S-K self-organized growth are distributed disorderly because the process of the S-K self-organized growth is random. The long-range ordered quantum dots may be achieved in a certain dimension by forming a regular pattern on the surface of a substrate material and then growing the quantum dots. However, a lot of crystal defects may be produced because of matrix damages in the manufacturing process, and hence a photoelectronic property of the quantum dot material is significantly affected.

In view of this, a method for manufacturing a quantum dot material is provided in the disclosure. In the method, when an epitaxial layer grows, a regularly distributed temperature field is applied on a surface of the epitaxial layer. Atom clustering effect at the locations with higher temperatures may be occurred more quickly than those at the locations with lower temperatures. Seeds of quantum dots may be orderly distributed under the effect of the temperature field, and the long-range ordered quantum dot material is accordingly manufactured.

For better understanding, the principle of the technical solution of the disclosure is briefly explained as follows.

When the quantum dots are generated, an epitaxial growth includes two stages. In the first stage, atomic layers grow layer by layer in two-dimensional (2D) mode on a surface of a substrate before the seeds are formed. In the second stage, the quantum dots grow in three-dimensional (3D) mode (because the quantum dots protrude from a planar of the growth) when and after the seeds are formed. The thickness of the atomic layers at a critical point from the growth in 2D mode to the growth in 3D mode is called as a critical thickness.

With a basis of abundant experiments, the temperature is a key factor for determining the critical thickness in a Molecular Beam Epitaxy (MBE) growth of the quantum dots. For example, when an InAs layer is epitaxially grown on a GaAs substrate, the critical thickness under a low temperature (lower than 430 degrees Celsius) is 2.5 times thicker than that under a high temperature (higher than 460 degrees Celsius). That is, the thicknesses of the epitaxial layer required for atom clustering effect are different under different temperatures. Usually, the critical thickness under the low temperature is thicker than that under the high temperature. The low temperature and the high temperature are merely relative concepts herein, and the difference therebetween may range from dozens of degrees Celsius to hundreds of degrees Celsius.

Based on the above principle, different temperatures may be regularly distributed on the surface of the epitaxial layer when the epitaxial layer grows on the substrate, the temperature in a part of locations may reach a high temperature corresponding to a first critical thickness, and the temperature in the other part of locations merely reach a low temperature corresponding to a second critical thickness. Predictably, when the thickness of the epitaxial layer is bigger than or equal to the first critical thickness and smaller than the second critical thickness, the atoms begin to cluster at the locations with the high temperature, while the atoms may not cluster at the locations with the low temperature. Therefore, the locations where the quantum dots are generated may be controlled by operators through the temperature distribution, and accordingly the long-range ordered quantum dots may be regularly distributed.

Consequently, the disclosure focuses on how to regularly distribute temperature field on the epitaxial layer.

Direct Writing Laser Interference Lithography (DW-LIL) is a mask-free, contamination-free, touch-free inventive technology, which may be directly written, has high efficiency (instant provision), may transform patterns by programs (by computer), may be manufactured in large scale and low cost, and has a low environmental requirement. A basic principle of the DW-LIL is to superpose two or more coherent laser beams and irradiate the surface of a sample with the superposed laser beams to produce an interference pattern. An electric field at the superposed area is a vector sum of electric fields of all coherent light beams. Different distributions of the electric field correspond to different interference patterns. The interference pattern generated by the interference of two light beams is a strip pattern with alternatively dark and bright striations. The interference pattern generated by the interference of three or four light beams is a periodic dot matrix in a shape of hexagon or square.

Figure 2:
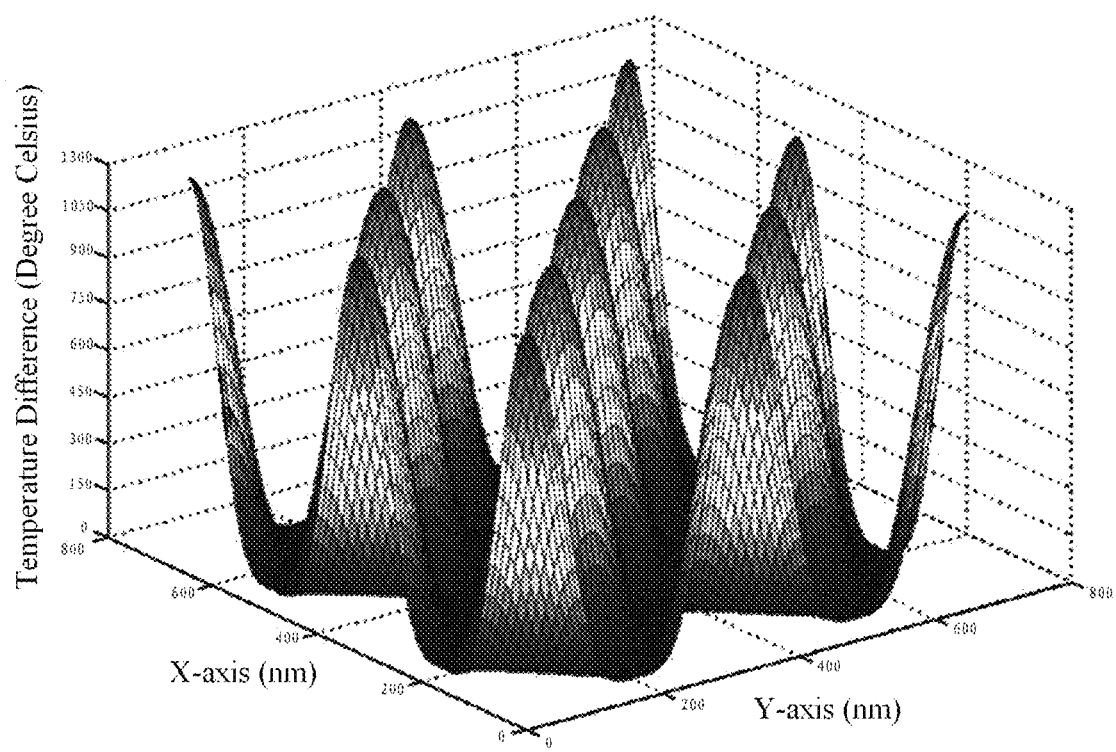
FIG. 2 is a diagram showing a temperature distribution of an interference pattern caused by three beam interference.

Usually, in the DW-LIL, an optical property of the interference pattern is applied to cause a variation of a photosensitive material in an interference enhancement area, i.e., in areas with bright strips or bright spots. In this way, a lithographic pattern is formed on the surface of the material. In some applications, a pattern may be formed by destructively punching the surface of the material with the high temperature of the beams. In this situation, the temperature distribution of the interference pattern is very important. FIG. 2 is a diagram showing a temperature distribution of an interference pattern produced by an interference of four light beams. As shown in FIG. 2, a difference between the highest temperature and the lowest temperature is more than 1000 degrees Celsius. It is indicated that, a periodic modulated temperature field with the temperature difference ranging from 0 degree Celsius to 1000 degrees Celsius is implemented by adjusting the power of a laser source. Therefore, a regular temperature field having a large range of the temperature variation is implemented with the pattern caused by a multiple-beam interference. Accordingly, the temperature may be controlled in the disclosure.

The embodiments of the disclosure are explained in detail hereinafter in conjunction with the drawings.

Figure 3:
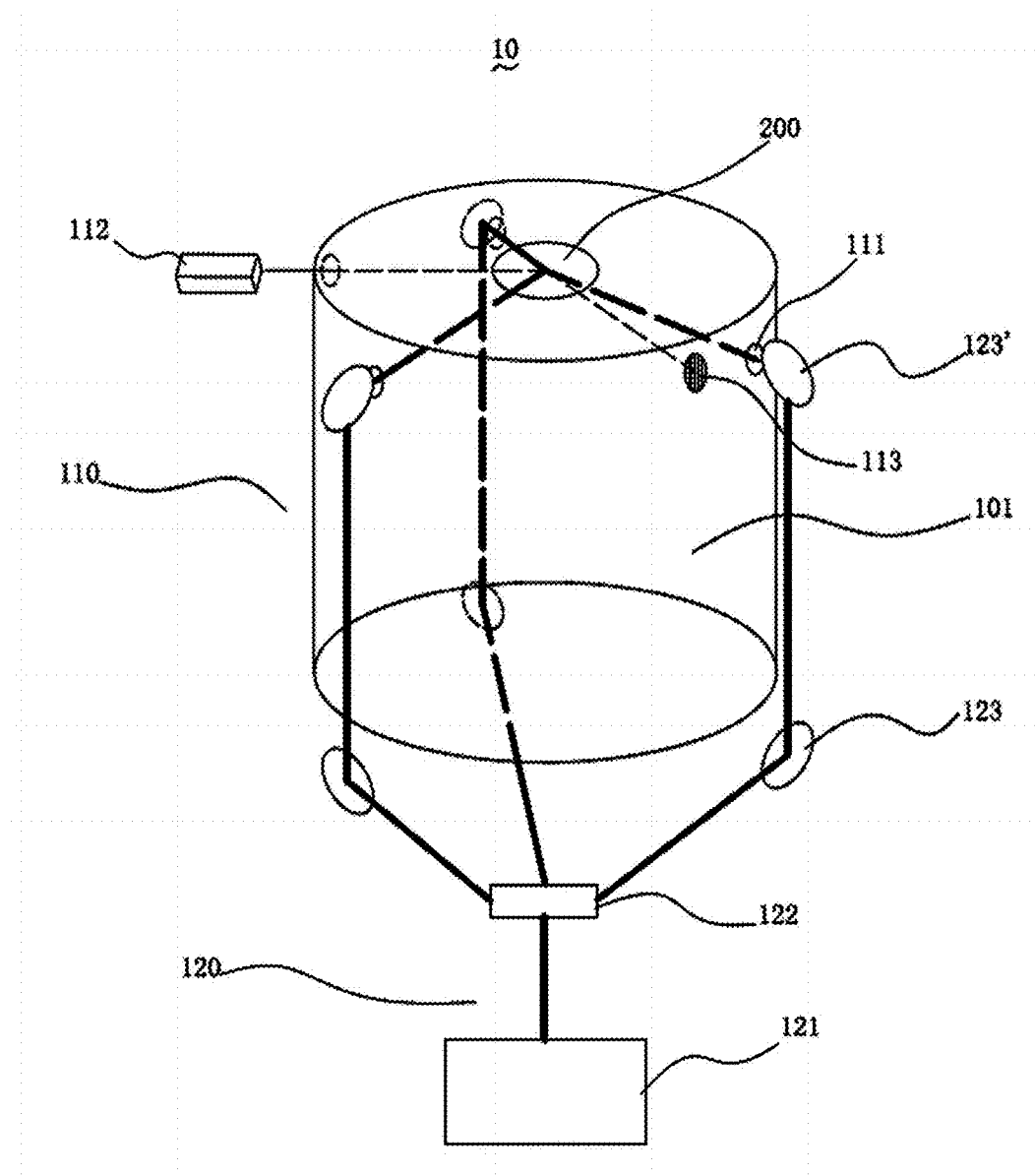
FIG. 3 shows an apparatus for manufacturing a quantum dot material according to a first embodiment of the disclosure.

FIG. 3 shows an apparatus for manufacturing a quantum dot material according to a first embodiment of the disclosure. As shown in FIG. 3, the apparatus 10 for manufacturing the quantum dot material in the disclosure includes an epitaxy device 110 and an optical device 120 for generating an interference pattern. The epitaxy device 110 includes a growth chamber 101.

The growth chamber 101 is a vacuum chamber and adapted to place a substrate material 200. Windows 111 are provided on wall of the growth chamber 101 to make light incident into the growth chamber. According to the embodiment of the disclosure, three beams are applied in interference; and thus three windows 111 are provided. The three windows 111 are evenly spaced on the walls of the growth chamber 101. After passing through the three windows 111, the three beams are clustered to generate the interference pattern, where an angle between any two beams is 120 degrees.

The optical device 120 includes a laser source 121 and an optical path 122. Various optical components such as a group of collimating lens, a group of zoom lens and a beam splitter are provided in the optical path 122 for adjusting and modulating the optical path. The beam splitter may be a beam splitter prism, a beam splitter grating, a binary optics element. A light beam is emitted form the laser source and is split into three beams by the optical path 122. Each of three beams is reflected by two reflectors 123 and 123', enter into the growth chamber 101 via the window 111 and produce the interference pattern on the surface of the substrate material 200.

Furthermore, in an MBE growth, the growth of atoms is usually required to be monitored. Hence, a Reflection High Energy Electron Diffraction (RHEED) device is further provided outside the growth chamber 101. The RHEED device includes an electron beam emitter 112 and a diffraction display window 113. The diffraction display window 113 is provided on the wall of the growth chamber 101 to display a diffraction image of an electron beam. In the case that an epitaxial layer has an uneven surface, the diffraction image may correspondingly change.

Figure 4:
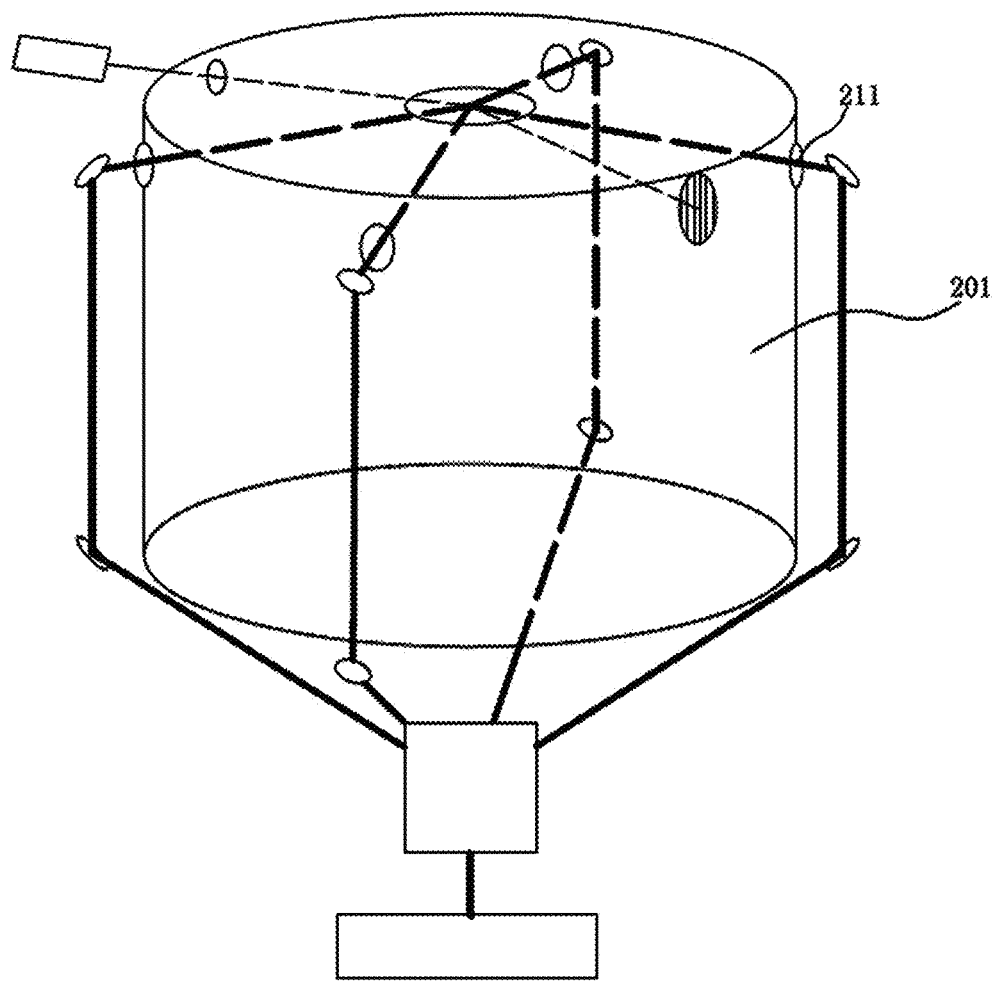
FIG. 4 shows an apparatus for manufacturing a quantum dot material according to a second embodiment of the disclosure.

FIG. 4 shows a device for manufacturing a quantum dot material according to a second embodiment of the disclosure. According to the embodiment, four beams are applied in the interference. Thus, four windows 211 for entrance of lights are provided on the wall of a growth chamber 201. The four windows 211 are evenly spaced on the wall of the growth chamber 201. After passing through the four windows 211, the four beams are clustered to generate an interference pattern, where an angle between any two beams is 90 degrees. The other component of the device according to second embodiment is similar to that according to the first embodiment, which will not be described in detail herein.

Figure 5:
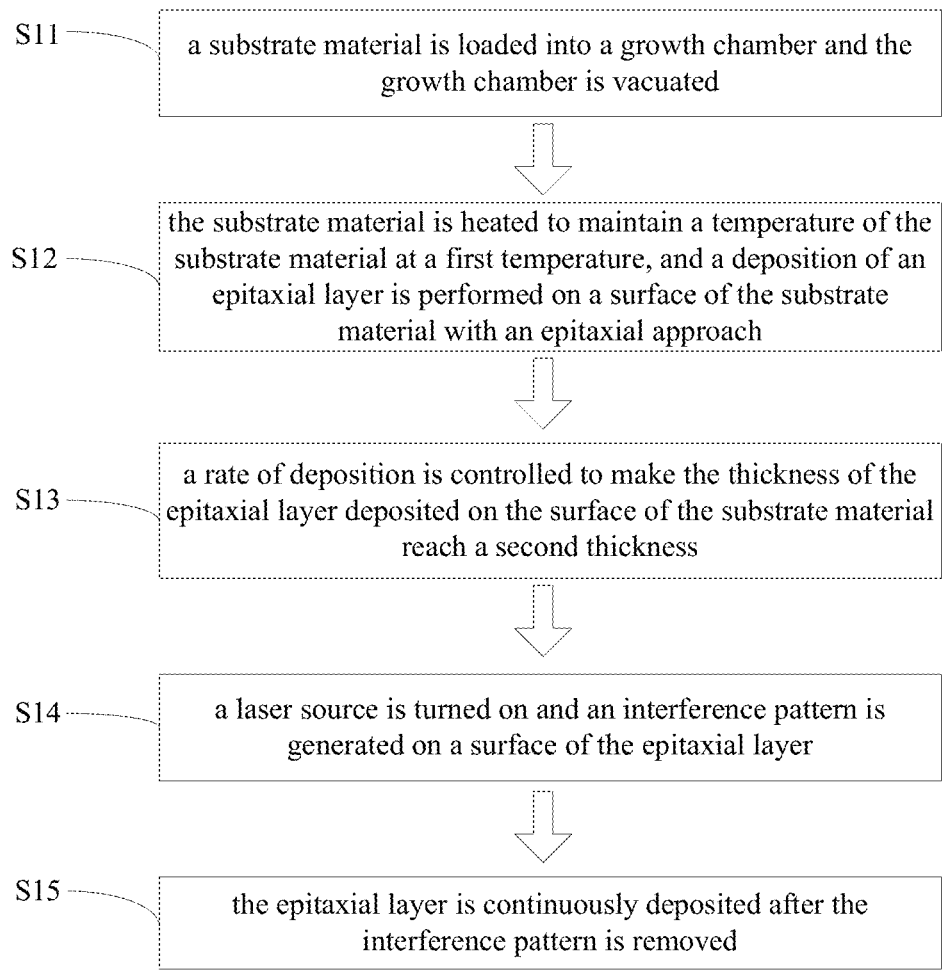
FIG. 5 is a flow chart of a method for manufacturing a quantum dot material according to the disclosure.

FIG. 5 is a flow chart of a method for manufacturing a quantum dot material according to the disclosure. As shown in FIG. 5, the method includes steps S11-S15.

In the step S11, a substrate material is loaded into a growth chamber and the growth chamber is vacuated.

In the step S12, the substrate material is heated to maintain a temperature of the substrate material at a first temperature, and a deposition of an epitaxial layer is performed on a surface of the substrate material with an epitaxial approach. The epitaxial layer has a lattice constant different from the substrate material. Under the first temperature, a critical thickness of the epitaxial layer is a first thickness, where when the epitaxial layer reaches the first thickness, atom clustering effect for releasing a lattice stress is happened.

The epitaxial approach includes Molecular Beam Epitaxy (MBE) and Metal-organic Chemical Vapor Deposition (MOCVD).

In the step S13, a rate of the deposition is controlled to make the thickness of the epitaxial layer deposited on the surface of the substrate material reach a second thickness. The second thickness is thinner than the first thickness. At this time, no atom is clustered on the epitaxial layer.

In the step S14, a laser source is turned on and an interference pattern is generated on a surface of the epitaxial layer. The interference pattern is a periodic dot matrix. At interference enhancement areas, i.e., bright spots, of the periodic dot matrix, the temperature of the epitaxial layer is raised to a second temperature. Under the second temperature, the critical thickness of the epitaxial layer is a third thickness, where when the epitaxial layer reaches the third thickness, the atom clustering effect for releasing the lattice stress is happened. The third thickness is thinner than a current thickness, i.e., the second thickness, of the epitaxial layer.

In this case, since the thickness of the epitaxial layer at the bright spots reach the critical thickness to release the lattice stress, the atom clustering effect is instantaneously happened at those locations. Atom clusters appear on an even surface of a former molecular layer. The atom clusters are seeds for subsequently growing quantum dots. At this time, an electron diffraction image observed by an electron diffraction screen is changed obviously. In the electron diffraction image, protruding points appear on a former even surface of the epitaxial layer. An obvious diffraction may be caused when an electron beam irradiates on the protruding points.

In the step S15, the epitaxial layer is continuously deposited after the interference pattern is removed. Here, Although the thickness of the epitaxial layer may exceed the first thickness, "windows" required for releasing the lattice stress at the whole epitaxial layer are provided at the locations where the atom clusters generated in the step S14, and thus the seeds may grow as the thickness of the epitaxial layer is increased. Finally, the quantum dots are generated on the surface of the epitaxial layer.

It should be noted that, a short pulse laser source is preferably applied in the disclosure. In the generated interference pattern, a distance between two bright spots is usually very close, which only has hundreds of nanometers, and thus the temperature of areas surrounding the bright spots may be increased because of heat conduction in the case of long time heating. Therefore, it is difficult to implement a temperature field with obvious temperature differences. However, with the short pulse laser source, since a period of one pulse is short, which is much shorter than a time required for the heat conduction, it is ensured that the temperature distribution on the surface of the epitaxial layer corresponds to the interference pattern.

Accordingly, the method and apparatus for manufacturing the quantum dot material are provided in the disclosure. Compared with existing epitaxy devices, the apparatus further includes the optical device for generating an interference pattern. The interference pattern is applied on the epitaxial layer when an epitaxy is performed on the substrate. The regularly distributed temperature field is formed on the epitaxial layer with the interference pattern. The atom clustering effect may appear on the locations of the epitaxial layer with high temperature, while no atom is clustered on the locations of the epitaxial layer with low temperature. Therefore, the locations where the quantum dots are generated may be controlled based on the temperature distribution on the surface of the epitaxial layer, and a method for manufacturing long-range ordered quantum dots is implemented. The principle for growing quantum dots with this method is the same as that with the S-K growth performed on an even surface, and thus a defect-free growth may be implemented.

The disclosure may be implemented or utilized by those skilled in the art with the foregoing description of the embodiments of the disclosure. Various alterations of the embodiments may be apparent for those skilled in the art. The general principle defined in the specification may be implemented in other embodiments without departing from the spirit or scope of the disclosure. Therefore, the disclosure may not be limited by the embodiment illustrated in the specification and the disclosure is intended to protect a broadest scope in alignment to the principle and novelty disclosed in the specification.

The invention claimed is:

1. An apparatus for manufacturing a quantum dot material, comprising:
   an epitaxy device; and
   an optical device for generating an interference pattern;
   wherein the epitaxy device comprises a growth chamber; the growth chamber is a vacuum chamber and adapted to place a substrate material, and a plurality of windows are provided on a wall of the growth chamber to make light incident into the growth chamber;
   wherein the optical device comprises a laser source and a modulating optical path; and
   wherein a light beam emitted from the laser source is split into a plurality of beams through the modulating optical path, the plurality of beams respectively pass through the plurality of windows, enter the growth chamber and produce the interference pattern on a surface of the substrate material.

2. The apparatus for manufacturing the quantum dot material according to claim 1, wherein the plurality of windows are three windows evenly spaced on the wall of the growth chamber.

3. The apparatus for manufacturing the quantum dot material according to claim 2, wherein the light beam emitted from the laser source is split into three beams through the modulating optical path, the three beams respectively pass through the three windows, enter the growth chamber and produce a three-beam interference pattern on the surface of the substrate material.

4. The apparatus for manufacturing the quantum dot material according to claim 1, wherein the plurality of windows are four windows evenly spaced on the wall of the growth chamber.

5. The apparatus for manufacturing the quantum dot material according to claim 4, wherein the light beam emitted from the laser source is split into four beams through the modulating optical path, the four beams respectively pass through the four windows, enter the growth chamber and produce a four-beam interference pattern on the surface of the substrate material.

6. The apparatus for manufacturing the quantum dot material according to claim 1, wherein the laser source is a pulse laser source.

7. A method for manufacturing a quantum dot material, wherein the method comprises:
   1) loading a substrate material into a growth chamber and vacuating the growth chamber;
   2) heating the substrate material to maintain a temperature of the substrate material at a first temperature, and performing a deposition of an epitaxial layer on a surface of the substrate material with an epitaxial approach;
   3) controlling a rate of the deposition to deposit the epitaxial layer having a second thickness on the surface of the substrate material, wherein the second thickness is thinner than a critical thickness under the first temperature;
   4) turning on a laser source and generating an interference pattern on a surface of the epitaxial layer, wherein a temperature of a part of locations on the epitaxial layer is raised to a second temperature based on the interference pattern, a critical thickness under the second temperature is thinner than the second thickness; and
   5) after removing the interference pattern, continuing the deposition of the epitaxial layer to finally form quantum dots on a surface of the epitaxial layer.

8. The method for manufacturing the quantum dot material according to claim 7, wherein the interference pattern is a periodic dot matrix, and in the periodic dot matrix, the temperature of the epitaxial layer is raised to the second temperature at interference enhancement areas of the periodic dot matrix.

* * * * *